(12) United States Patent
Strip et al.

(10) Patent No.: US 7,108,392 B2
(45) Date of Patent: Sep. 19, 2006

(54) TILED FLAT PANEL LIGHTING SYSTEM

(75) Inventors: David R. Strip, Albuquerque, NM (US); Giana M. Phelan, Rochester, NY (US); Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 38 days.

(21) Appl. No.: 10/838,697

(22) Filed: May 4, 2004

(65) Prior Publication Data

US 2005/0248935 A1    Nov. 10, 2005

(51) Int. Cl.
*F21S 8/00* (2006.01)

(52) U.S. Cl. ...................... 362/145; 362/147
(58) Field of Classification Search ............... 362/145; 313/607, 631
See application file for complete search history.

(56) References Cited

U.S. PATENT DOCUMENTS

| | | | |
|---|---|---|---|
| 4,365,244 A | 12/1982 | Gillessen et al. | |
| 6,498,592 B1 | 12/2002 | Matthies | |
| 6,526,000 B1 | 2/2003 | Charneski | |
| 6,565,231 B1 * | 5/2003 | Cok | 362/653 |
| 6,729,740 B1 * | 5/2004 | Gazard | 362/100 |
| 6,787,990 B1 * | 9/2004 | Cok | 313/504 |
| 6,787,994 B1 * | 9/2004 | Cok | 313/512 |
| 6,841,949 B1 * | 1/2005 | Duggal | 315/169.3 |
| 2003/0016197 A1 | 1/2003 | Smith | |
| 2003/0146882 A1 | 8/2003 | Ogino et al. | |
| 2004/0016568 A1 * | 1/2004 | Palanisamy | 174/260 |
| 2005/0094394 A1 * | 5/2005 | Padiyath et al. | 362/249 |

FOREIGN PATENT DOCUMENTS

| | | |
|---|---|---|
| EP | 0 039 160 | 11/1981 |
| EP | 1 265 125 | 12/2002 |
| GB | 2 366 900 | 3/2002 |

* cited by examiner

*Primary Examiner*—Alan Cariaso
*Assistant Examiner*—Leah S Lovell
(74) *Attorney, Agent, or Firm*—Andrew J. Anderson

(57) ABSTRACT

A tiled flat panel lighting system includes flat panel light emitting units, each unit comprising a light emitting region and at least two pairs of first and second electrical contacts which are accessible external to the unit, wherein the first electrical contacts of the pairs are electrically connected within the unit, the second electrical contacts of the pairs are electrically connected within the unit, the light emitting region is electrically connected to the connected first contacts and to the connected second contacts. A plurality of units may be electrically interconnected through pairs of the externally accessible first and second electrical contacts positioned at one or more adjacent edges of each of the units. In a further embodiment, a tiled flat panel lighting system comprising a plurality of flat panel light emitting units, wherein at least two of the flat panel light emitting units contain controllers, where the plurality of units are interconnected through contacts positioned at one or more adjacent edges of each of the units, wherein the interconnections provide for communications signals between the controllers.

45 Claims, 13 Drawing Sheets

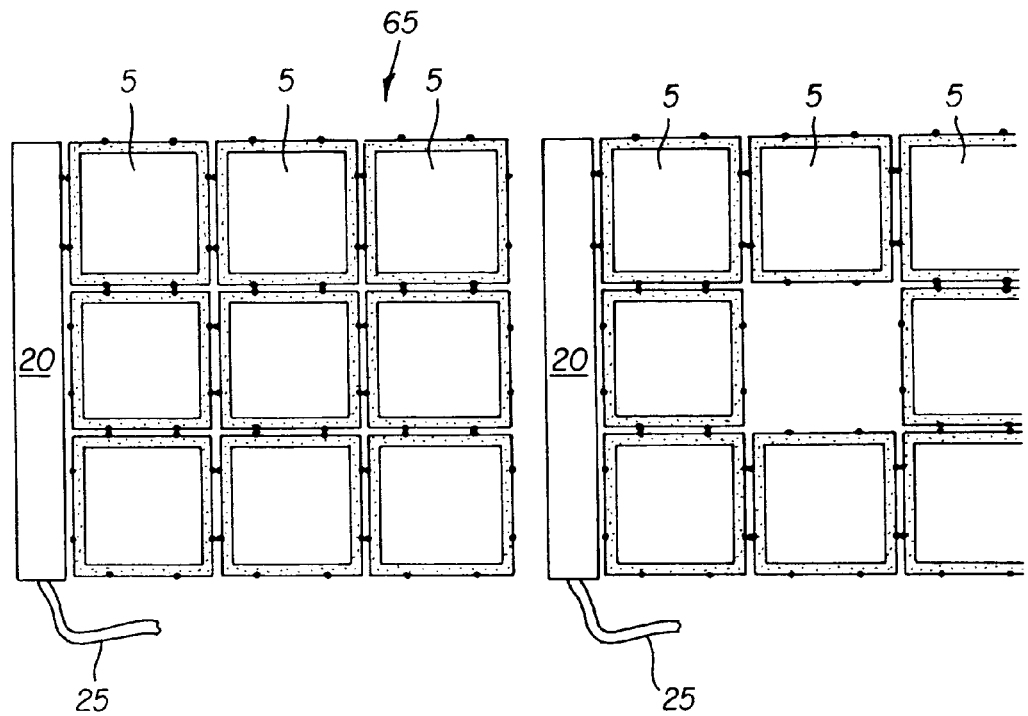
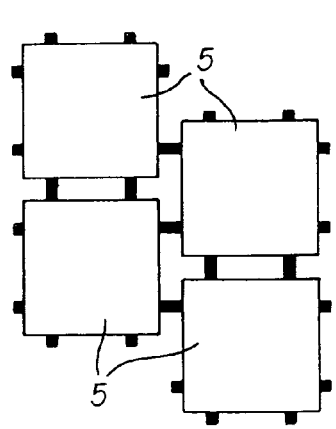
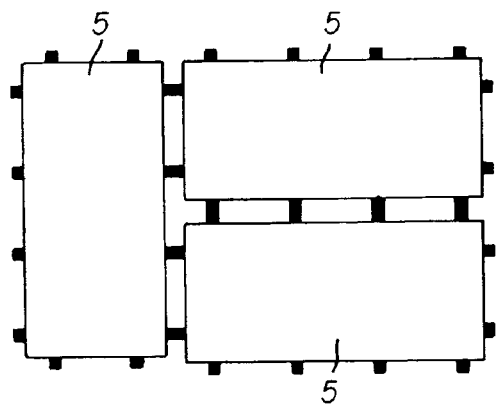
FIG. 3a    FIG. 3b    FIG. 3c    FIG. 3d

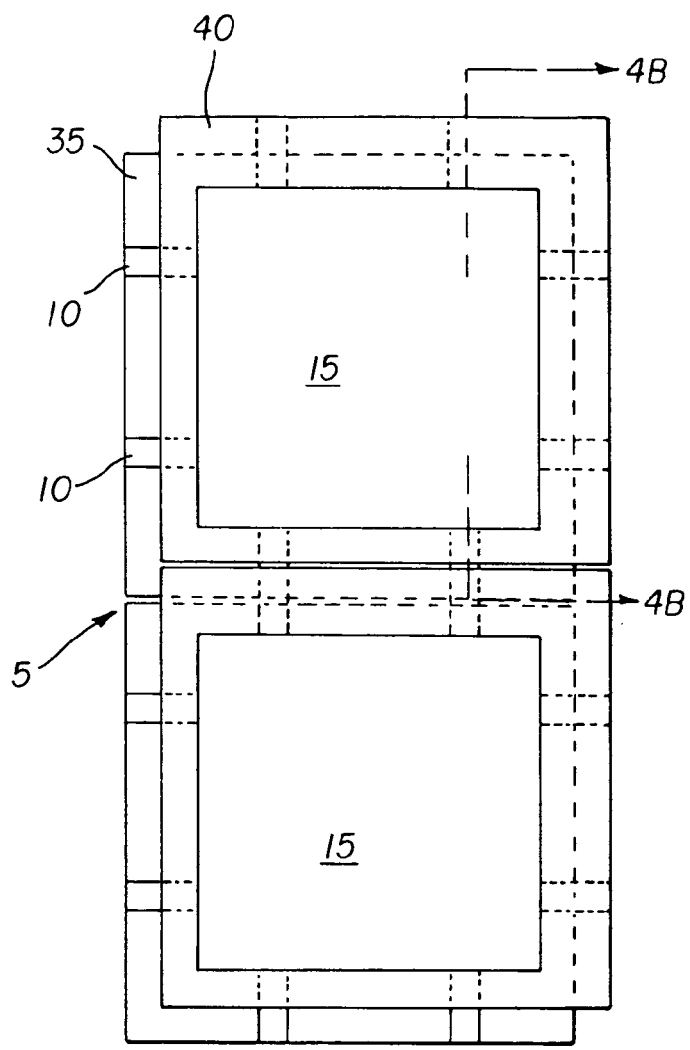
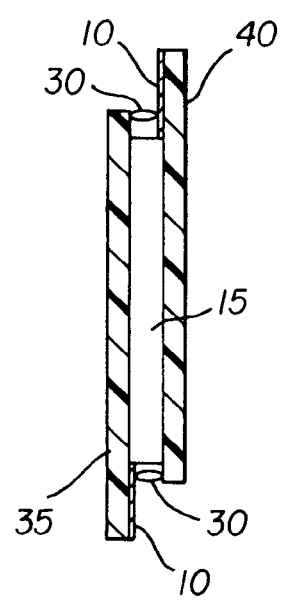
FIG. 4B
FIG. 4A

TILED FLAT PANEL LIGHTING SYSTEM

FIELD OF THE INVENTION

The present invention relates to flat panel light sources, and more particularly to structures for electrically connecting a plurality of flat panel light sources.

BACKGROUND OF THE INVENTION

Flat panel light sources are a new technology and suffer from numerous limitations that impede their use in commercial products. For example, current manufacturing technology limits the ability to economically produce large panels due to issues in managing defects. Manufacturing and inventory management issues also lead to limitations in the variety of available flat panel light sizes. Yet another limitation is introduced by lack of adequate flexible barrier and substrate materials. A consequence of this limitation is the inability to easily produce lamps that can conform to different specific shapes.

Unlike existing commercially available lighting sources such as incandescent and fluorescent bulbs, which have well-established standards for sockets and bases, flat panel light sources have no broadly accepted means for connection to power sources. U.S. Pat. No. 6,565,231 provides a first description of a system comprised of a socket and contacts on a flat panel light source. This system is limiting in that it provides for a very narrow range of possible configurations of the flat panel light sources.

There is a need therefore for an improved design of flat panel lighting devices to provide for the design flexibility that is provided by having large panels, panels in a wide variety of sizes, and panels that can be formed into a variety of shapes.

SUMMARY OF THE INVENTION

In accordance with one embodiment, the invention is directed towards a flat panel light emitting unit for use in a tiled flat panel lighting system, the unit comprising a light emitting region and at least two pairs of first and second electrical contacts which are accessible external to the unit, wherein the first electrical contacts of the pairs are electrically connected within the unit, the second electrical contacts of the pairs are electrically connected within the unit, and the light emitting region is electrically connected to the connected first contacts and to the connected second contacts. In accordance with a further embodiment, the invention is directed towards a tiled flat panel lighting system comprising a plurality of such flat panel light emitting units, wherein each unit is of pre-determined size and shape and wherein the plurality of units are electrically interconnected through pairs of the externally accessible first and second electrical contacts positioned at one or more adjacent edges of each of the units. In yet a further embodiment, the invention is directed towards a tiled flat panel lighting system comprising a plurality of flat panel light emitting units, wherein each unit is of pre-determined size and shape and wherein at least two of the flat panel light emitting units contain controllers, where the plurality of units are interconnected through contacts positioned at one or more adjacent edges of each of the units, wherein the interconnections provide for communications signals between the controllers.

In its various embodiment, the present invention provides a system of flat panel lighting tiles with a system of interconnection and termination to facilitate the assembly of large flat panel lights with a wide variety of size choices as well as the ability to produce three dimensional surfaces. The tiled flat panel lighting system of the present invention allows flat panel lights to made in a variety of sizes and shapes without incurring additional manufacturing costs for each new size. In addition, the invention enables lights to be produced with three-dimensional forms. The tiled flat panel lighting system also provides a robust means for producing large area lighting sources by providing a means to allow removal and replacement of failed elements within the large system. The system further allows the individual elements to be reconfigured to other shapes. The system also provides for making lighting products by permanently combining lighting elements (tiles) and connectors.

BRIEF DESCRIPTION OF THE DRAWINGS

FIGS. 3a, 3b, 3c, and 3d show potential planar configurations of the tile shown in FIG. 1.

FIG. 4 is a plan view and section view of a second embodiment of the invention.

DETAILED DESCRIPTION OF THE INVENTION

Figure 1:
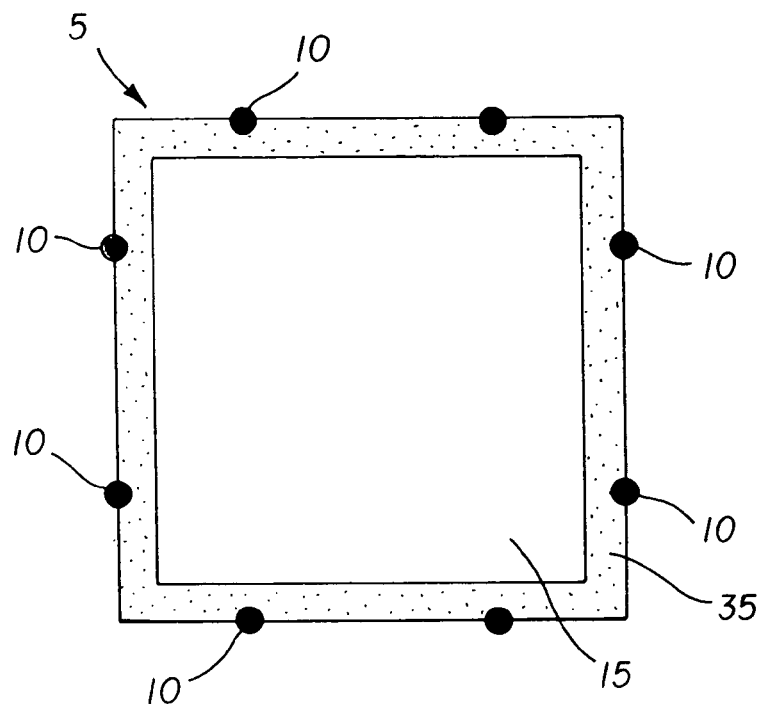
FIG. 1 is a single flat panel light source tile according to one embodiment of the invention.

Referring to FIG. 1, a single tile 5 of a tiled flat panel lighting system is comprised of a substrate 35 upon which a set of contacts 10 and a light emitting region 15 are produced. Although drawn diagrammatically in this figure, it will be well-understood by those skilled in the art that the contacts may take a variety of forms. For example, if the light emitting region is an OLED, the contacts may, be exposed regions of the anode and cathode of the OLED device. Alternatively, the contacts may be spring metal which is connected electrically to the light emitting region. Although the tile is shown as a square, the tile may be rectangular, triangular, hexagonal, or any other shape. Further, the contacts may be present on only a subset of the edges, although there must be at least two sets of contacts on the tile. Multiple sets of contacts may be present on an edge to allow a larger tile to be connected to multiple smaller tiles. The light emitting region may contain multiple light emitting elements, such as discrete LEDs or an OLED as disclosed in U.S. Pat. No. 6,693,296.

Figure 2:
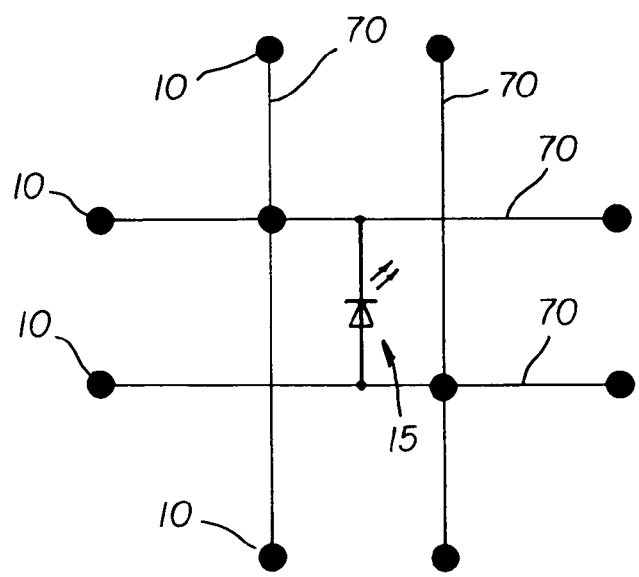
FIG. 2 is an electrical schematic of the tile shown in FIG. 1.

FIG. 2 is a schematic diagram of the electrical connections within a single tile 5. The schematic illustrates that the contacts 10 on opposing edges of the tile are connected to one another via conductors 70 to allow power to be transmitted from one tile to the next. The light emitting region, shown here as an OLED 15 is connected to the conductors such that a device failed in the open state does not impact the ability of the tile to conduct power to adjacent tiles. The generalization of this schematic to tiles with multiple sets of contacts on an edge, or to tiles with other than four sides will be obvious to one skilled in the art. It will be further understood by those of ordinary skill in the art that other circuit arrangements can be utilized to provide the same electrical performance.

Planar arrangements of tiles may be located on a variety of surfaces, for example, ceilings, walls, and floors to provide ambient area illumination or to perform a decorative function. Tiles 5 may be aligned in a complete grid as shown in FIG. 3a. FIG. 3b illustrates the ability to leave voids in the grid. In either instance, where the tiles comprise electrical connections as depicted in FIG. 2, the alignment of the electrical contacts between adjacent tiles provides for the tiles to be connected in parallel. Alternatively, rows or columns may be offset with respect to each other in a variety of configurations, for example as shown in FIGS. 3c and 3d. In FIG. 3c, an alternative electrical schematic (not shown) may be used to provide for parallel connections between the tiles.

In an additional embodiment, an array of tiles may be connected to more than one electrical circuit to provide adequate power for a large number of tiles. An array of tiles may also be divided into subsets, each of which is uniquely connected to one of the circuits. In this case, tiles in a common array may not have inter-tile electrical connections between the tiles connected to different circuits. In such case, an adjoining edge between subsets of tiles may not have electrical contact points. Alternatively, an array of electrically connected tiles may be connected to two separate electrical circuits, thereby connecting the separate circuits into a common electrical circuit through the array of tiles. In various embodiments, multiple groups of tiles, where each group is connected to a different common circuit, may be mechanically connected into a larger array of integrated tiles.

FIGS. 3a and 3b further demonstrate a tiled flat panel lamp 65 comprised of multiple tiles 5 and a terminator 20. The terminator provides an interface between the tiles and a power supply via a power cord 25. The terminator may optionally contain other control features such as an on-off switch, dimmer, or other control apparatus. The power supply may be internal to the terminator, particularly in the form of batteries. Yet another option would be to include apparatus for inductively coupling power to the terminator. For example, a transmitting inductive loop might be embedded at multiple locations in a wall or other surface. A receiving inductive loop may then be incorporated in the terminator 20 (or in a backplane 85 discussed below with respect to FIG. 12), eliminating the need for either a power cord or batteries. The resulting combination adds substantial flexibility of use. The terminator may optionally contain power conditioning functionality, such as a ballast for the flat panel light source. By using tiles of different sizes and shapes, arbitrary patterns can be produced utilizing this invention. It is also possible for an array of tiles to include more than one terminator, with or without a power supply. That is, a tiled array may be connected to a power supply at multiple points and with one or more physical terminator devices. Depending on the nature of the product, the tiles may be permanently connected to one another, or the connection may be made in an easily reversible way, allowing a failed panel to be easily replaced.

FIG. 4 shows an embodiment of a tile 5 in which the tile is comprised of a substrate 35 and a cover 40, joined via a seal 30. The substrate and cover are displaced with respect to one another in such a manner as to leave contacts 10 exposed on both the substrate and cover, where the contacts on the substrate are aligned with the contacts on the cover on the opposing edge. Tiles may be laid adjoining one another, overlapping the exposed substrate contacts of one with the exposed cover contacts of the adjacent tile form an electrical circuit transmitting power from one device to the next. Note that the alignment of these contacts is the same as in that of FIGS. 1 and 2. In the OLED case, this precludes the direct use of the anode and cathode layers to form the contacts to provide a parallel electrical connection between adjacent tiles. Additional conductors (not shown) may be employed in such case to provide electrical contact between the appropriate exposed substrate contacts in such embodiment to enable parallel electrical connections.

Figure 5A:
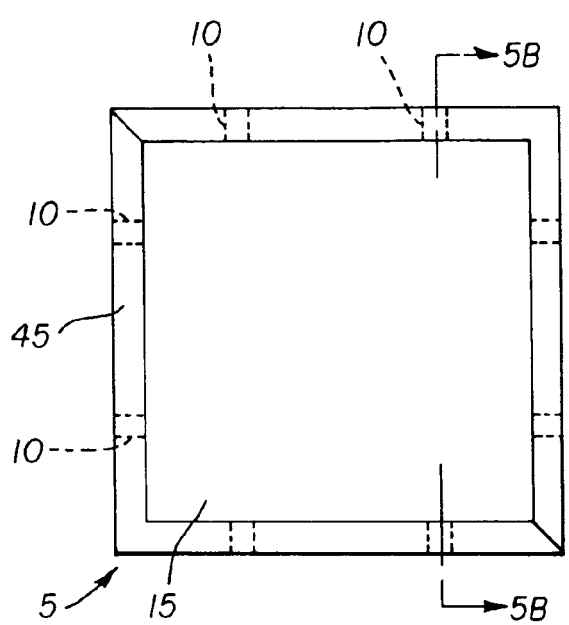
FIG. 5 is a plan view and section view of a third embodiment of the invention.
Figure 5B:
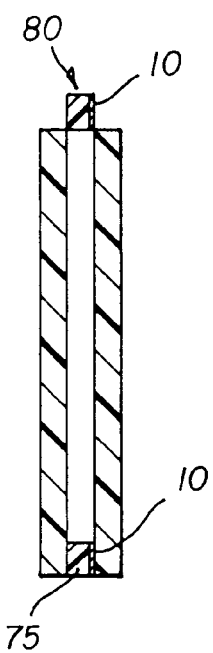

FIG. 5 shows an alternative embodiment in which the light emitting region 15 is surrounded by frame 45 which extends beyond the light emitting region. The frame may be made out of a variety of materials, such as a plastic or ceramic. It is probably most easily produced using a non-conducting material, but need not. In this embodiment, the frame contains the contacts 10. The frame contains a recessed region 75 and a protruding region 80 which are designed such that the protruding region can be inserted into the recessed region to make electrical contact. In addition to providing electrical contacts, the frame may provide mechanical support, alignment, and attachment. The frame may contain additional features, such as means to provide for a positive mechanical interlock of adjacent tiles or a means to mount the frame and tile to a support. A framed tile approach may be particularly appropriate for those cases in which the light emitting medium is flexible, or fragile and difficult to handle. Light emitting devices produced on flexible substrates may especially benefit from a system utilizing frames. Flexible frames may be a good match to flexible OLEDs.

Figure 6:
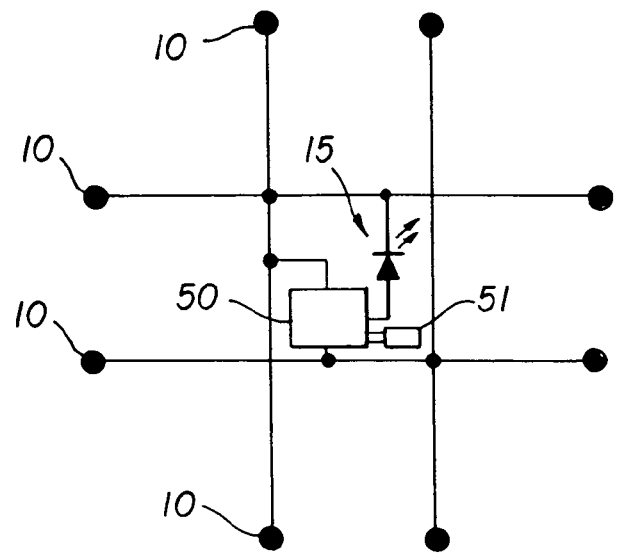
FIG. 6 is a schematic view of a fourth embodiment of the invention.

FIG. 6 is a schematic diagram of an alternative embodiment in which the tile 5 contains a controller 50. The controller interface 51 provides an external means to determine the operational mode of the controller. The controller interface may be any of a number of forms. For example, it may be a switch or rotary dial affixed to the tile. It may be an IR remote, similar to a TV remote. It may be an RF interface. It may be a sensor, for example, one capable of measuring ambient light intensity or voltage level at the device inputs. The operational effect of the controller can take many forms. Examples include dimming the tile, switching the tile on or off at a time programmed via the interface, blinking the tile at a rate programmed via the interface, changing the color of the tile's emission, adjusting the tile output in response to a sensor input, etc.

A variety of lighting effects may be used in commercial, residential, entertainment, and business environments to establish mood, communicate information, provoke emotional response, stimulate interest, or otherwise effect people in the vicinity of the lights. Virtually any effect possible with present incandescent or fluorescent light technology and their associated controllers can be implemented using a flat panel solid state lighting sources, including either LEDs, OLEDs, or a combination of the two. Examples of the effects include gradients across a large panel or an illuminated wall and animated effects such as blinking lights, moving patterns, and directional indications. Other effects involve variations in color or intensity, both spatially and temporally. Lights that respond to the environment are also included in this class, where the lamp may respond to ambient illumination levels, occupancy of a space, time, or almost any other phenomenon that can be measured with a sensor. The lighting effects may also be under direct program control, as in a theater. The placement of the lights and the associated effects may be indoors, outdoors, or in transitional zones.

Figure 7:
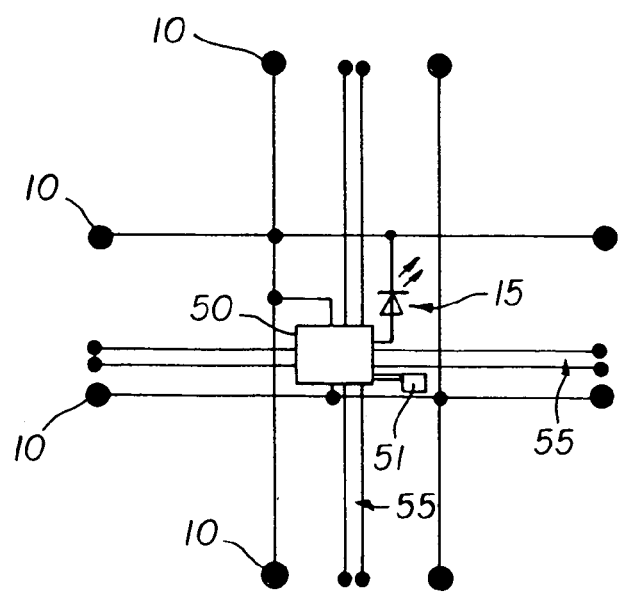
FIG. 7 is a schematic view of a fifth embodiment of the invention.

FIG. 7 is a schematic diagram of an alternative embodiment of a tile with a controller. In this embodiment, the controller 50 is able to communicate with controllers in adjacent tiles via contacts 55. In addition to being able to communicate with adjacent tiles, either communications contacts or the controller interface could be connected to an external computer for the purpose of downloading instructions, or to provide other input, such as a music signal which would serve as input to the controller to produce a display that is synchronized to the music. This embodiment provides a means for coordinated action between tiles. In addition to the functions described for the embodiment in FIG. 6, this embodiment can provide effects such as light sweeping across a row of tiles, coordinated color changes, etc. In addition, this embodiment provides the opportunity for sophisticated behaviors, such as programming a grid of tiles to simulate phenomena based on the state of other tiles. These types of behaviors are often referred to as cellular automata. One well known and early example of a cellular automaton is Conway's Game of Life. (ref: Martin Gardner, *Mathematical Games: The fantastic combinations of John Conway's new solitaire game "life"*, Scientific American 223 (October 1970):120–123.) Tiles produced with controllers such as this may often be produced as toys or entertainment devices. Additional functionality that may be provided by a controller is specific behaviors to compensate for failures or defects in the controlled panel or in other panels in the system. For example, if one panel fails, the remaining panels might be commanded by their controller to emit brighter light, maintaining a constant luminous output for the entire tiled array.

Figure 8:
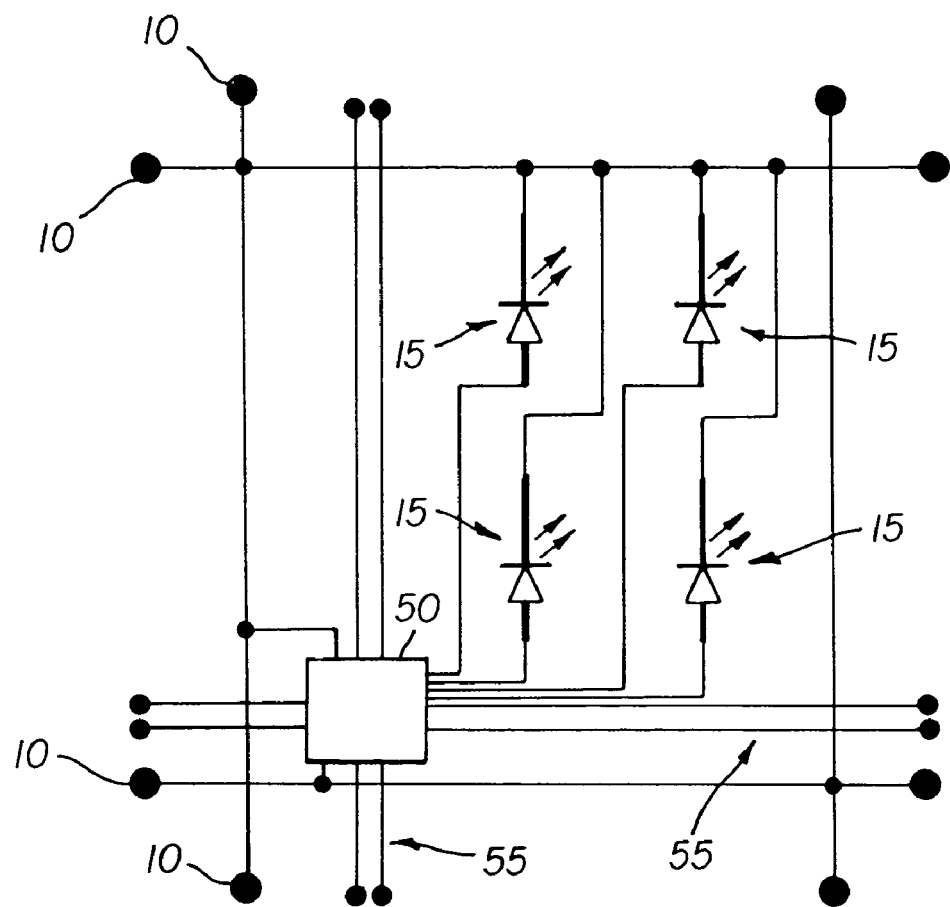
FIG. 8 is a schematic of a sixth embodiment of the invention.

FIG. 8 is a schematic diagram of yet another embodiment of a tile containing a controller. This embodiment emphasizes that the tile may contain multiple light emitting regions 15 which can be independently activated by the controller 50. Thus, for a tiled flat panel lighting system designed to operate as a cellular automaton, multiple cells of the automaton may be fabricated on a single tile. This is particularly important when the device is intended as an entertainment device or toy. This embodiment also facilitates the assembly of a display by utilizing a large number of tiles.

Figure 9:
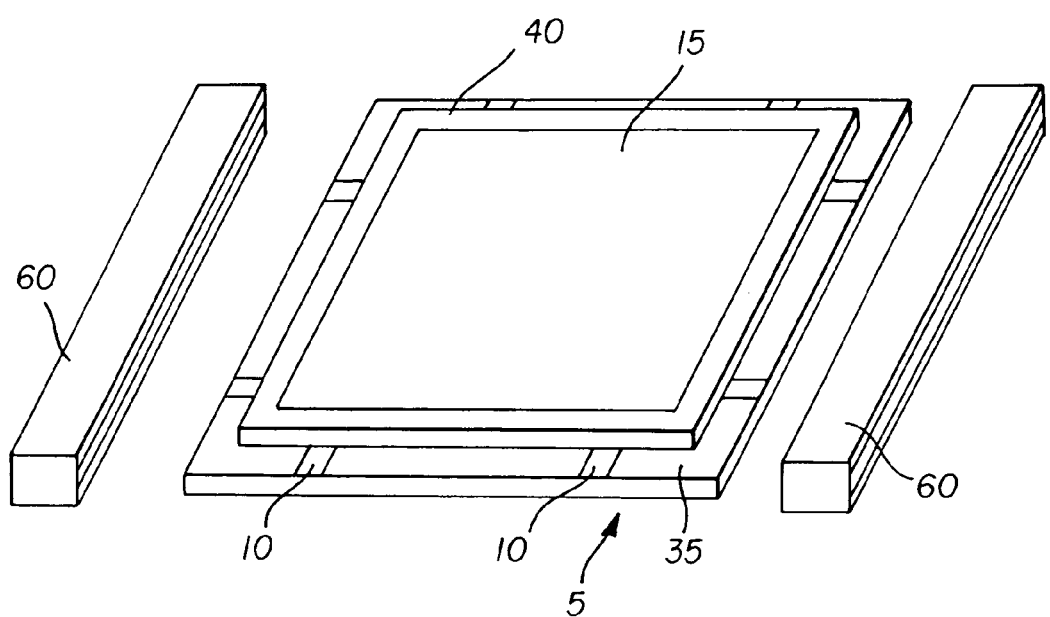
FIG. 9 is a perspective view of a seventh embodiment of the invention.
Figure 10:
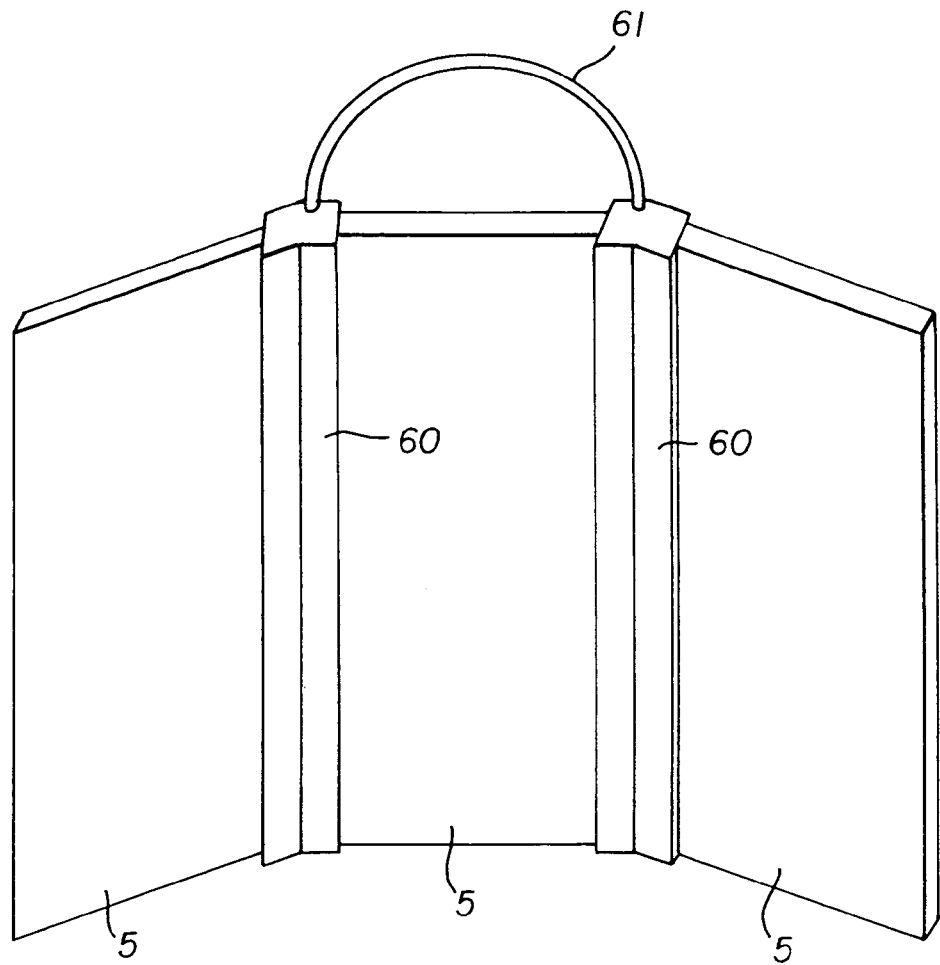
FIG. 10 is a perspective view of an eighth embodiment of the invention.
Figure 11:
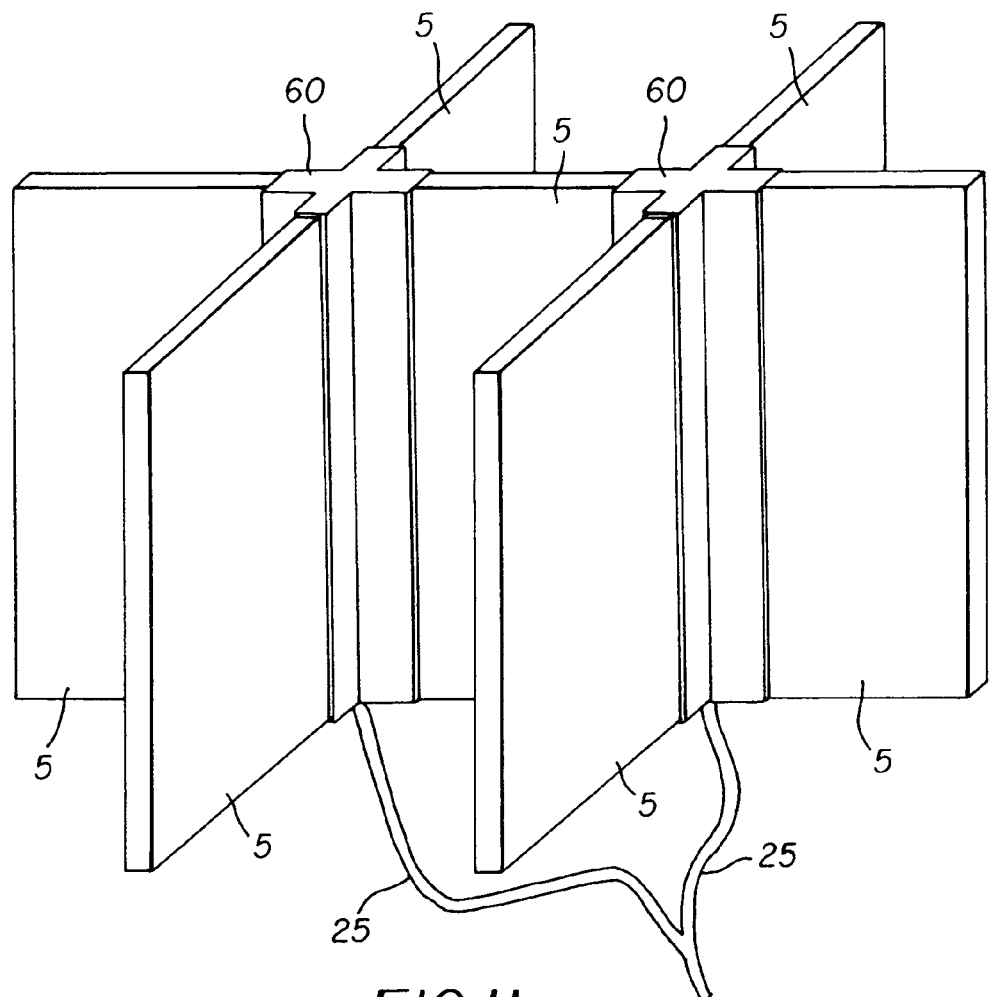
FIG. 11 is a perspective view of a ninth embodiment of the invention.

FIG. 9 is a perspective view of an alternative embodiment of a tiled flat panel lighting system in which tiles 5 are connected to one another via an external connector 60. The external connector may be made of a variety of materials, with plastics and ceramics being the most common. The connector provides a means of transmitting power and signals between adjacent tiles attached to the connector. The connector may be rigid, flexible, or articulated. The articulation may be either translational, rotational, or a combination of both. In addition to providing electrical connection, the connector may provide structural connection and support for the tiles. The attachment of the tiles to the connector may be reversible, allowable replacement of failed tiles or to replace a tile with one or different characteristics. Alternatively, the attachment may be permanent. FIG. 10 illustrates three tiles 5 connected via rigid, angled connectors 60. Some available technologies for creating the light emitting region may make it difficult to provide a reliable path for power to be transferred from one edge of the tile to another. It may also be difficult to provide signal conductors on the tile without incurring large cost. In these cases, the connectors 60 can be provided with a electrical conductor 61 to provide an alternative way to route power or signals to increase reliability or lower costs. In other cases it may be possible to incorporate high quality conductors directly into the tile, even when they have no functional relationship to the light-emitting region. FIG. 11 draws attention to the fact that the connector is not limited to connecting two tiles. In this case, each connector 60 joins four tiles 5. In addition, the figure illustrates the capability of using the connector as a terminator with a power cord 25 to connect to a power supply. As in the case of the earlier terminator in FIG. 3, the terminator may contain a power source, such as batteries. The arrangement shown in FIG. 11 shows a redundant connection of the power to the tiles by providing both connectors with a power cord 25. This arrangement demonstrates the system's ability to provide multiple power pathways to insure robustness in the face of potential failures in connectors or tiles.

The present invention may be employed to provide an extended illuminated area. For example, the Tiled Flat-Panel Lighting system may provide an illuminated, tiled surface in a plane, as shown in FIGS. 3a–3d. Alternatively, the system may provide segments of curves as shown in FIG. 10. A variety of solid, three-dimensional geometric structures or patterns may be formed as suggested by FIG. 11, for example cubes or tetrahedrons or portions thereof. Some tile elements may have different colors, allowing aesthetically pleasing combinations of structures and shapes.

Figure 13:
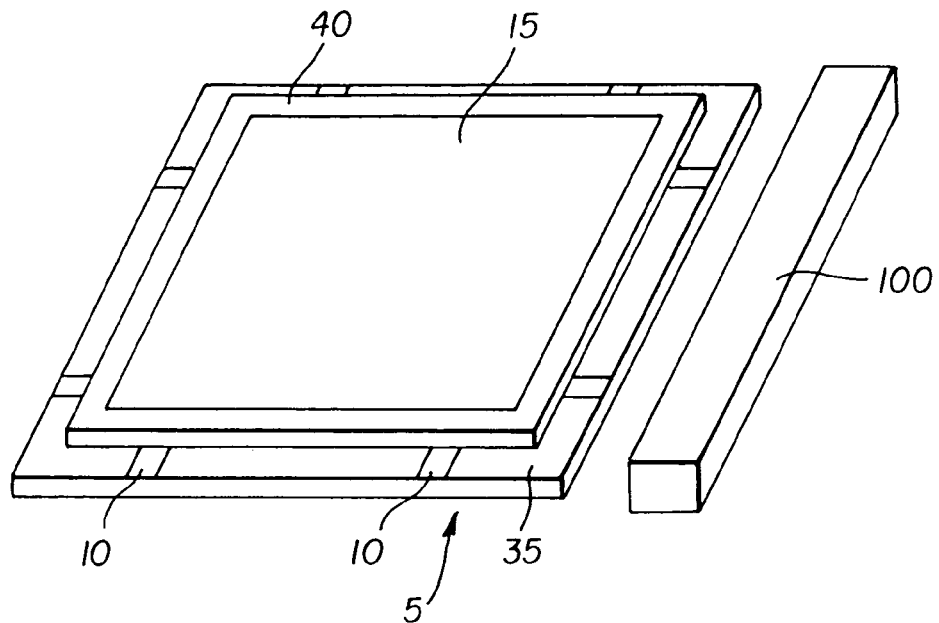
FIG. 13 is a perspective view of an edge protector.

In many of the embodiments presented, the contacts at the edges of the array of tiles are left exposed, creating an electrical shock hazard. FIG. 13 illustrates an insulating edge protector 100. The insulating edge protector covers the contacts at the edge of one or more tiles. Depending on the design of the tile, the insulating edge connector may contain no electrical contacts. Alternatively, it may provide electrical termination for either the power contacts or the signal contacts of a controller. The termination of power or signal conductors may include making electrical connection between two or more contacts at the edge of the tile. The use of an insulating edge protector is not the only means for providing electrical safety at the edge of an array. The system allows for specific edge and corner tiles that contain no exposed contacts at the edge of the array. These edge and corner tiles would have one or more edges with no contacts. In general, these edge and corner tiles would still have two or more sets of contacts, though in some special cases, such as linear arrays of tiles, the end tile would have only two contacts, as taught in U.S. Pat. No. 6,565,231.

Figure 12:
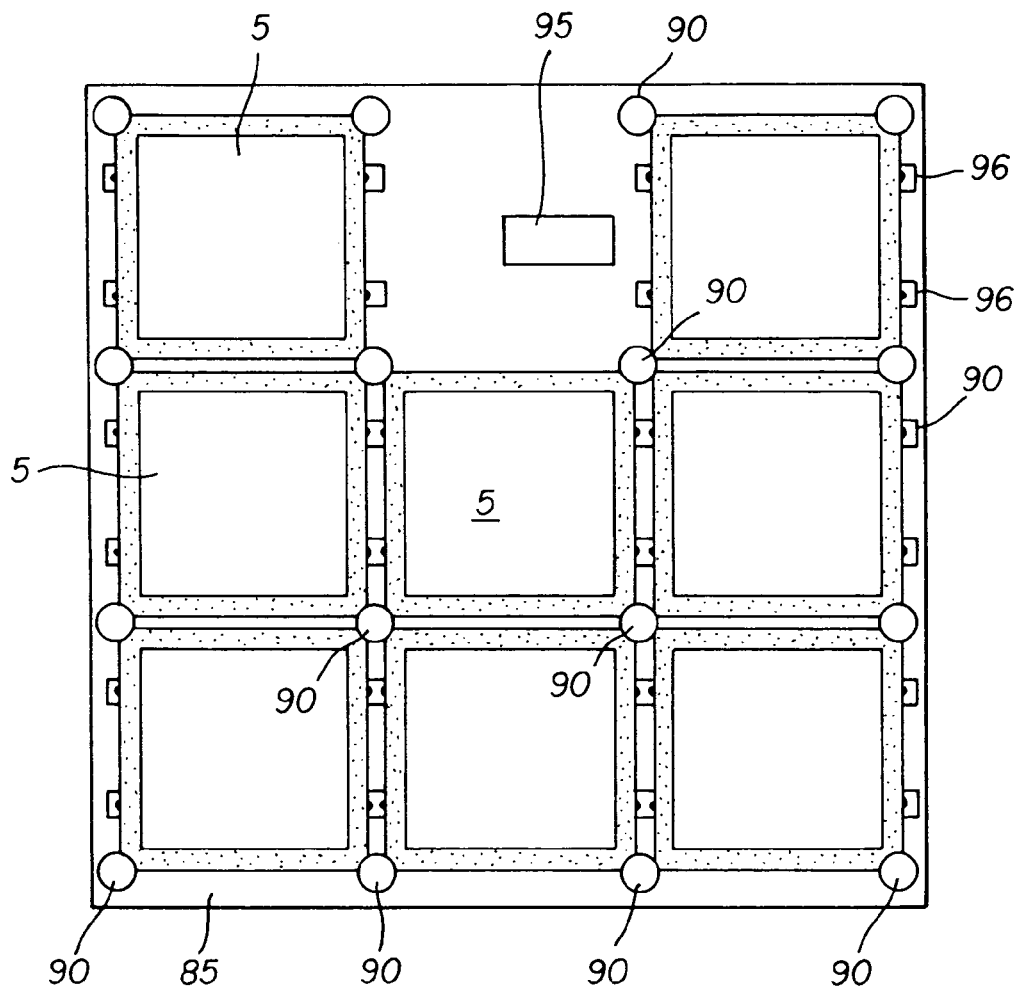
FIG. 12 is a plan view of a tenth embodiment of the invention.

FIG. 12 is an alternative embodiment utilizing a backplane 85 to support and provide electrical connections to tiles 5. Conductors and contacts on the backplane provide electrical current to contacts on at least one of the tiles. Contacts 96 provide electrical connection from one tile to an adjacent tile. In FIG. 12, only horizontal interconnects are shown. However, other patterns of connection between and among tiles will be easily understood to one of ordinary skill in the art. The backplane may be rigid, flexible, or articulated. The articulation may be rotational, translational, or a combination of the two. Retainers 90 provide mechanical retention of the tiles to the backplane. These retainers could be provided in a variety of forms. They could be snap-clips that latch over the tile or latch to mating features on the tile. For applications in which the tiles are frequently rearranged, the retainers could be a hook and loop fabric (e.g., Velcro®). The tiles could be permanently glued to the backplane in certain applications. Numerous other retention systems exist, such as push-and-twist retainers, screws, etc. As in embodiments disclosed earlier in this application, the tile may contain multiple light emitting regions, possibly with individual control for each region. The tiles may contain a controller and controller interface and may be individually addressable through signals on the backplane. In the case of tiles with a controller, the backplane may supply additional conductors to make contact with controller contacts on the tile to provide communication between controls on different tiles or to an optional backplane controller 95. Although the backplane shown here is square and utilizes square tiles, it will be understood that the backplane may have other shapes to support corresponding tiles shapes, or may even be designed to allow use with multiple, different tile shapes.

Figure 14:
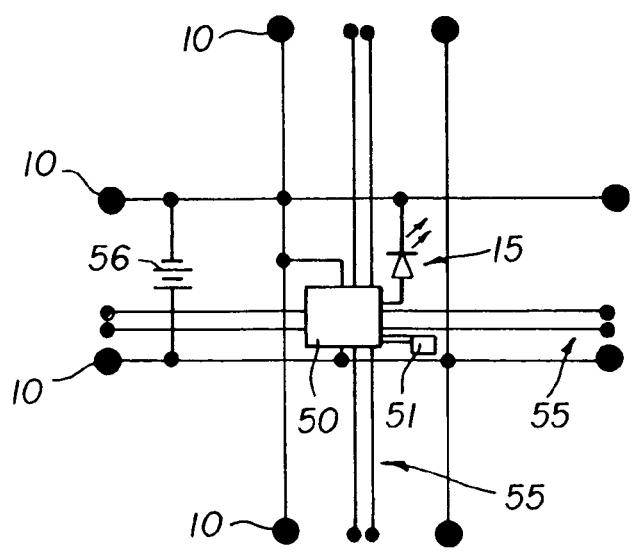
FIG. 14 is a schematic view of an eleventh embodiment of the invention.
Figure 15:
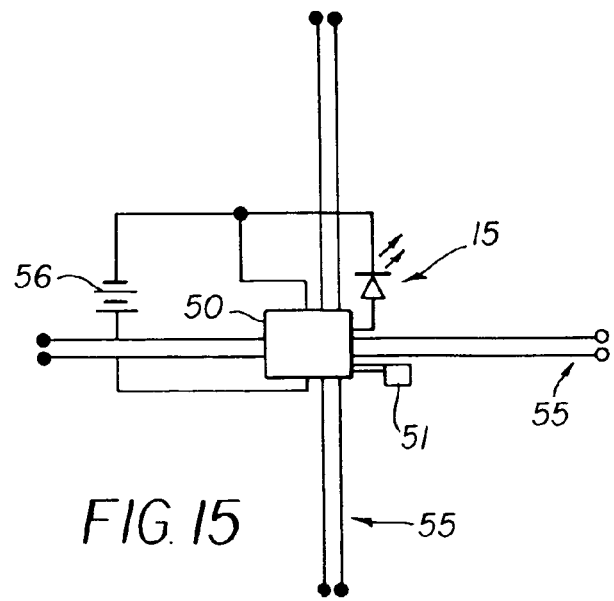
FIG. 15 is a schematic view of a twelfth embodiment of the invention.

FIG. 14 is a schematic diagram of another embodiment in which individual tiles contain a battery 56. This embodiment is particularly useful when the tiled flat panel lighting system is intended for use by children, as it removes the presence of dangerous wall current power supplies. This embodiment is also useful for applications in locations where line power is not available. The contacts 10 to adjacent tiles may be used to share power between tiles, especially in the case where not all the tiles contain a battery. Additionally, power may be applied from an external source via the contacts (and possibly conducted through intervening tiles) to recharge a rechargeable battery, if present. FIG. 15 is a schematic of an alternative embodiment of a tile containing a battery 56, controller 50, and controller contacts 55, where in this embodiment, there are no contacts at the tile edges to provide power distribution between tiles.

Figure 16:
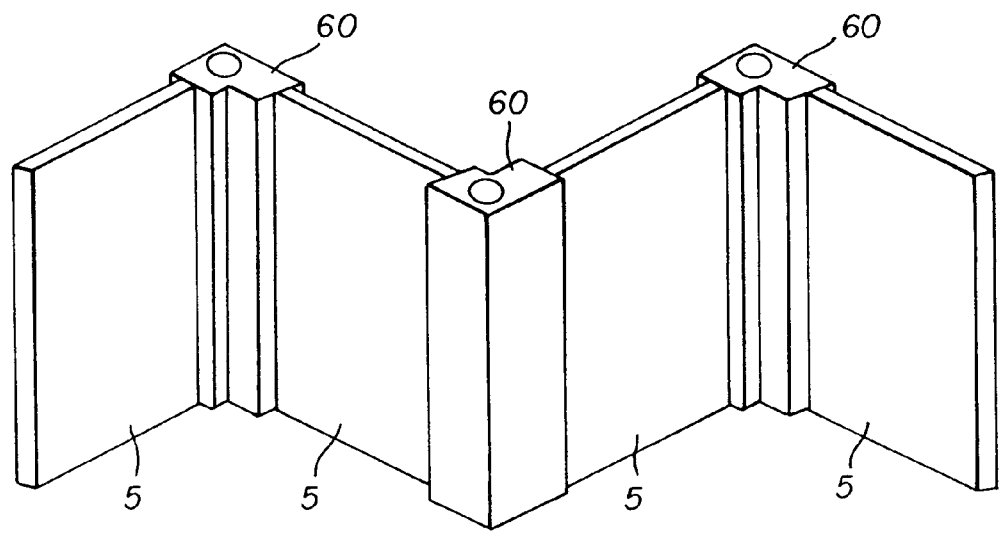
FIG. 16 is a perspective view of an embodiment of the invention as a portable light source.

FIG. 16 shows how the invention can be used to provide portable light sources. In this embodiment, three tiles 5 and a battery 56 are connected together via hinged connectors 60 which allow the assembly to be folded into a compact flat form easily carried in a purse or pocket. This fan-fold configuration can be extended to a larger number of panels, or reduced to fewer. The battery can be incorporated into a light-emitting tile, as shown in FIG. 14, or could be temporarily attached back-to-back with a light-emitting tile via the connector, or an entire tile could be replaced with a battery with a form factor and contacts compatible with the connector. If the connectors in FIG. 10 are hinged, that configuration would similarly be viewed as a tri-fold configuration. Connectors which allow the portable light source to fold may include a hinged connector, a flexible connector, a hinged backplane, or even a flexible backplane upon which the tiles are mounted. The tiles may be mounted so that light is emitted from both sides of the portable light source. The folding mechanism may further contain a locking mechanism which causes the portable lamp to be rigid in the unfolded configuration.

Figure 17A:
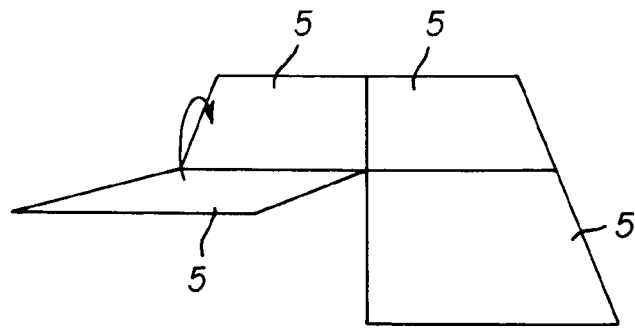
FIGS. 17a, 17b and 17c are perspective views of a further embodiment of the invention as a portable light source.
Figure 17B:
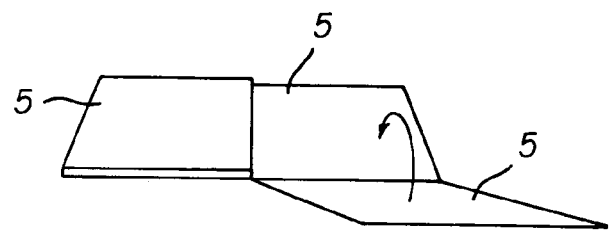
Figure 17C:
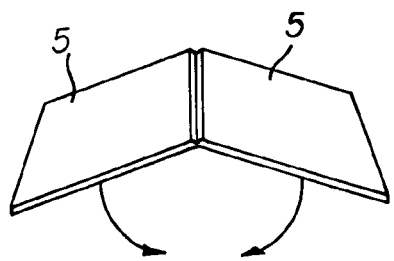

FIGS. 17a, 17b and 17c demonstrate an alternative folding embodiment in which a portable lamp is comprised of four tiles hinged in a manner to allow the assembly to be folded, much like a game board, into an area one-fourth the area of the unfolded assembly. The connectors are omitted from this drawing for clarity, but would be hinged connectors as in FIG. 16. The batteries for this unit could be integrated into the tile or the connectors, may be sandwiched back-to-back with one or more tiles, or may be substituted for one of the tiles. As noted for the fanfold configuration in FIG. 16, there are many possible ways to implement this configuration, including hinged connectors, flexible connectors, hinged backplanes, or flexible backplanes. Likewise, this configuration may emit light from both faces and may contain a locking mechanism to hold the unfolded panel open.

In a preferred embodiment, the invention is employed in a device that includes Organic Light Emitting Diodes (OLEDs) which are composed of small molecule or polymeric OLED materials as disclosed in but not limited to commonly-assigned U.S. Pat. No. 4,769,292, issued Sep. 6, 1988 to Tang et al., entitled "Electroluminescent Device with Modified Thin Film Luminescent Zone" and commonly-assigned U.S. Pat. No. 5,061,569, issued Oct. 29, 1991 to VanSlyke et al., entitled "Electroluminescent Device with Organic Electroluminescent Medium". Many combinations and variations of organic light emitting materials can be used to fabricate such a device.

Substrate

The OLED apparatus of this invention is typically provided over a supporting substrate where either the cathode or anode can be in contact with the substrate. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Any one or more of the substrate, anode, or cathode may be transparent.

Anode

When EL emission is through the anode, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes or by using shadow masks during preparation.

Hole-Injecting Layer (HIL)

It is often useful to provide a hole-injecting layer between the anode and the emissive layer. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in commonly assigned U.S. Pat. No. 4,720,432, and plasma-deposited fluorocarbon polymers as described in commonly assigned U.S. Pat. No. 6,208,075. Alternative hole-injecting materials reportedly useful in organic EL devices are described in EP 0 891 121 A1 and EP 1 029 909 A1.

Hole-Transporting Layer (HTL)

The hole-transporting layer contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al in commonly-assigned U.S. Pat. Nos. 3,567,450 and 3,658,520.

A more preferred class of aromatic tertiary amines are those which include at least two aromatic tertiary amine moieties as described in commonly-assigned U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in commonly-assigned U.S. Pat. Nos. 4,769,292 and 5,935,721, the light-emitting layer (LEL) of the organic EL element includes a luminescent or fluorescent material where electroluminescence is produced as a result of electron-hole pair recombination in this region. The light-emitting layer can include a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in commonly assigned U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-µ-oxo-bis(2-methyl-8-quinolinolato)aluminum(III)
CO-5: Indium trisoxine [alias, tris(8-quinolinolato)indium]

CO-6: Aluminum tris(5-methyloxine) [alias, tris(5-methyl-8-quinolinolato)aluminum(III)]

CO-7: Lithium oxine [alias, (8-quinolinolato)lithium(I)]

CO-8: Gallium oxine [alias, tris(8-quinolinolato)gallium(III)]

CO-9: Zirconium oxine [alias, tetra(8-quinolinolato)zirconium(IV)]

Other classes of useful host materials include, but are not limited to: derivatives of anthracene, such as 9,10-di-(2-naphthyl)anthracene and derivatives thereof, distyrylarylene derivatives as described in U.S. Pat. No. 5,121,029, and benzazole derivatives, for example, 2,2',2"-(1,3,5-phenylene) tris[1-phenyl-1H-benzimidazole].

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives and carbostyryl compounds.

Electron-Transporting Layer (ETL)

Preferred thin film-forming materials for use in forming the electron-transporting layer of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in commonly assigned U.S. Pat. No. 4,356,429 and various heterocyclic optical brighteners as described in commonly assigned U.S. Pat. No. 4,539,507. Benzazoles and triazines are also useful electron-transporting materials.

In some instances, the light-emitting layer and electron-transport layers can optionally be collapsed into a single layer that serves the function of supporting both light emission and electron transport. These layers can be collapsed in both small molecule OLED systems and in polymeric OLED systems. For example, in polymeric systems, it is common to employ a hole-transporting layer such as PEDOT-PSS with a polymeric light-emitting layer such as PPV. In this system, PPV serves the function of supporting both light emission and electron transport.

Cathode

When light emission is solely through the anode, the cathode used in this invention can include nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in commonly assigned U.S. Pat. No. 4,885,221. Another suitable class of cathode materials includes bilayers including a thin electron-injection layer (EIL) in contact with the organic layer (e.g., ETL) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in commonly assigned U.S. Pat. No. 5,677,572.

Other useful cathode material sets include, but are not limited to, those disclosed in commonly assigned U.S. Pat. Nos. 5,059,861; 5,059,862, and 6,140,763.

When light emission is through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211; 5,247,190; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459; 6,278,236. EP 1 076 368, and JP 3,234,963. Cathode materials are typically deposited by evaporation, sputtering, or chemical vapor deposition. When needed, patterning can be achieved through many well known methods including, but not limited to, through-mask deposition, integral shadow masking as described in commonly assigned U.S. Pat. No. 5,276,380 and EP 0 732 868, laser ablation, and selective chemical vapor deposition.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in commonly-assigned U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (commonly-assigned U.S. Pat. No. 5,294,870), spatially-defined thermal dye transfer from a donor sheet (commonly-assigned U.S. Pat. Nos. 5,851,709 and 6,066,357) and inkjet method (commonly-assigned U.S. Pat. No. 6,066,357).

Encapsulation

Most OLEDs are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

The invention has been described in detail with particular reference to certain preferred embodiments thereof, but it will be understood that variations and modifications can be effected within the spirit and scope of the invention.

PARTS LIST

5 Flat panel light source tile
10 Electrical contacts
15 Light emitting region
20 Terminator
25 Power cord
30 Seal
35 Substrate
40 Cover 45 Frame
50 Controller
51 Controller interface
55 Controller contacts
56 Battery
60 Connector
61 Electrical conductor
65 Tiled flat panel lamp
70 Conductor
75 Recessed region
80 Protruding region
85 Backplane
90 Retainer
95 Backplane controller
96 Backplane contacts
100 Insulating edge protector

The invention claimed is:

1. A flat panel light emitting unit for use in a tiled flat panel lighting system, the unit comprising a light emitting region and at least two pairs of first and second electrical contacts which are accessible external to the unit, wherein the first electrical contacts of the pairs are electrically connected within the unit, the second electrical contacts of the pairs are electrically connected within the unit, and the light emitting region is electrically connected to the connected first contacts and to the connected second contacts.

2. A tiled flat panel lighting system comprising a plurality of flat panel light emitting units according to claim 1, wherein each unit is of pre-determined size and shape and wherein the plurality of units are electrically interconnected through pairs of the externally accessible first and second electrical contacts positioned at one or more adjacent edges of each of the units.

3. The lighting system of claim 2, where the adjacent units are electrically interconnected by conductive bumps located at predetermined locations on one or more adjacent edges of the units.

4. The lighting system of claim 2, where the adjacent units are electrically interconnected by spring metal conductors at predetermined locations on one or more adjacent edges or faces of the units.

5. The lighting system of claim 2, further comprising a terminating unit positioned along an edge of at least one unit, where the terminating unit provides an interface for the plurality of interconnected units to a source of electrical power.

6. The lighting system of claim 5, where the terminating unit contains controls or power conditioning for the electrically interconnected lighting units.

7. The lighting system of claim 2, where each flat panel light emitting unit contains a substrate and cover, where the cover is disposed over the substrate in such a manner as to leave exposed a region of the substrate containing two adjacent edges of the substrate and a similar region on the cover containing two adjacent edges of the cover, and each region exposes the externally accessible first and second electrical contacts.

8. The lighting system of claim 2, where each flat panel light emitting unit is comprised of a flat panel light emitting region attached to a frame and the pairs of first and second electrical contacts are located on outside edges of the frame, such that the frames of adjacent units conduct electrical current between adjacent flat panel light emitting units.

9. The lighting system of claim 8, wherein the frames provide mechanical attachment and alignment between adjacent units in addition to electrical contact.

10. The lighting system of claim 2, wherein at least one of the flat panel light emitting units contains a controller.

11. The lighting system of claim 10, wherein the flat panel light emitting unit containing the controller is comprised of a plurality of light emitting regions, each region being controllable independently by the controller.

12. The lighting system of claim 10, wherein a plurality of the flat panel light emitting unit contain a controller, and further comprising electrical conductors to enable signals from one controller to be transmitted to a controller in an adjacent flat panel light emitting unit.

13. The lighting system of claim 12 wherein the flat panel light emitting region of each of the plurality of flat panel light emitting units containing a controller is comprised of a plurality of light emitting sub-regions, each sub-region being controllable independently by the controller.

14. The lighting system of claim 2, further comprising an external connector connecting at least two adjacent units, the external connector being capable of conducting electrical current between the flat panel light emitting units attached to the connector.

15. The lighting system of claim 14, where the external connector provides mechanical attachment and alignment of at least two units in addition to electrical connection.

16. The lighting system of claim 14, where the external connector is flexible.

17. The lighting system of claim 14, where the external connector is hinged.

18. The lighting system of claim 14, where the external connector provides a rotary connection.

19. The lighting system of claim 14, where the external connector is connected to a second external connector or to a terminating unit via conductors capable of carrying the power required to illuminate one or more panels.

20. The lighting system of claim 14, where the units are affixed to the connector using a reversible process.

21. The lighting system of claim 14, where the units are affixed to the connector in a permanent manner.

22. The lighting system of claim 2, additionally comprised of an insulated edge protector which covers exposed contacts on at least one edge of at least one unit.

23. The lighting system of claim 2, wherein at least one of the light emitting units contains a battery.

24. The lighting system of claim 2, wherein the light emitting units have a rectangular, triangular, or hexagonal shape.

25. The lighting system of claim 2, including a plurality of light emitting units which emit light of different colors.

26. The lighting system of claim 2, wherein at least one of the light emitting units is comprised of a plurality of light emitting regions, each region emitting one of one or more colors of light.

27. The lighting system of claim 2, wherein the plurality of light emitting units are interconnected in a plane.

28. The lighting system of claim 2, wherein the light emitting units are interconnected at an angle to each other so that the light emitting units do not lie in a plane.

29. The lighting system of claim 28, wherein the light emitting units are interconnected to form a segmented curve.

30. The lighting system of claim 28, wherein the light emitting units are interconnected to form the sides of a geometric solid.

31. The lighting system of claim 2, wherein each unit comprising electrical conductors that directly connect the interconnected pairs of first and second electrical contacts positioned at one or more adjacent edges of the units in a parallel configuration.

32. The lighting system of claim 31, wherein when one of the plurality of units fails to emit light, the electrical conductors provide power to adjacent interconnected units.

33. The lighting system of claim 2, comprising a plurality of units arranged in an array.

34. The lighting system of claim 33, wherein the array of units form an area illumination device.

35. The lighting system of claim 34, wherein the area illumination device is formed as part of or on a ceiling, wall, or floor.

36. The lighting system of claim 34, further comprising one or more connectors connecting adjacent units, and wherein the array of units folds into a compact, portable configuration.

37. The portable lighting system of claim 36, wherein the array of units contains a power source.

38. The portable lighting system of claim 36, wherein batteries are contained in at least one connector.

39. The lighting system of claim 2, wherein individual flat panel light emitting units are flexible.

40. The lighting system of claim 39, further comprising a rigid frame to which the individual flexible units are attached.

41. A lighting system of claim 2, further comprising a backplane containing conductors, contacts, and a means of retaining the plurality of flat panel light emitting units, where the adjacent units are electrically interconnected by conductors and contacts provided in the backplane.

42. The lighting system of claim 41, where the backplane contains a controller and conductors to control the appearance of the flat panel light emitting units.

43. The lighting system of claim 2, where the electrically interconnected flat panel units are connected to more than one electrical circuit.

44. The lighting system of claim 2, comprising two sets of electrically interconnected flat panel units, each set being connected to a separate electrical circuit and where the two sets are mechanically connected.

45. A tiled flat panel lighting system comprising a plurality of flat panel light emitting units, wherein each unit is of pre-determined size and shape and wherein at least two of the flat panel light emitting units contain controllers, where the plurality of units are interconnected through contacts positioned at one or more adjacent edges of each of the units, wherein the interconnections provide for communications signals between the controllers.

* * * * *